United States Patent
Bourgeault et al.

(10) Patent No.: US 8,191,028 B1
(45) Date of Patent: May 29, 2012

(54) METHODS AND SYSTEMS FOR IMPROVING A MAXIMUM OPERATING FREQUENCY OF AN INTEGRATED CIRCUIT DURING A ROUTE PHASE

(75) Inventors: Mark Bourgeault, Mississauga (CA); Vaughn Betz, Toronto (CA)

(73) Assignee: Altera Corporation, San Jose, CA (US)

( * ) Notice: Subject to any disclaimer, the term of this patent is extended or adjusted under 35 U.S.C. 154(b) by 208 days.

(21) Appl. No.: 12/419,986

(22) Filed: Apr. 7, 2009

(51) Int. Cl.
*G06F 9/455* (2006.01)
*G06F 17/50* (2006.01)

(52) U.S. Cl. ........ 716/134; 716/113; 716/119; 716/132; 716/108

(58) Field of Classification Search .................. 716/113, 716/116, 108, 119, 132, 134
See application file for complete search history.

(56) References Cited

U.S. PATENT DOCUMENTS

| | | | |
|---|---|---|---|
| 5,072,402 A | 12/1991 | Ashtaputre et al. | |
| 5,408,434 A | 4/1995 | Stansfield | |
| 5,452,010 A | 9/1995 | Doornink | |
| 5,452,239 A * | 9/1995 | Dai et al. ........................ | 703/19 |
| 6,191,609 B1 | 2/2001 | Chan et al. | |
| 6,490,717 B1 | 12/2002 | Pedersen et al. | |
| 6,763,506 B1 | 7/2004 | Betz et al. | |
| 7,000,137 B2 | 2/2006 | Silvaraman | |
| 7,051,312 B1 | 5/2006 | Rahut et al. | |
| 7,058,919 B1 | 6/2006 | Young et al. | |
| 7,088,136 B1 | 8/2006 | Lewis | |
| 7,088,606 B2 | 8/2006 | Turner | |
| 7,093,084 B1 | 8/2006 | Leblanc | |
| 7,120,883 B1 | 10/2006 | Van Antwerpen et al. | |
| 7,135,789 B2 | 11/2006 | Boros et al. | |
| 7,185,299 B1 | 2/2007 | Jayaraman | |
| 7,290,232 B1 | 10/2007 | Fung et al. | |
| 7,337,100 B1 | 2/2008 | Hutton et al. | |
| 7,360,190 B1 | 4/2008 | Singh et al. | |
| 7,412,680 B1 | 8/2008 | Gouterman et al. | |
| 7,444,613 B1 | 10/2008 | Chiu et al. | |
| 7,464,286 B1 | 12/2008 | Singh et al. | |
| 2003/0023941 A1 * | 1/2003 | Wang et al. ........................ | 716/4 |
| 2003/0051222 A1 * | 3/2003 | Williams et al. ................ | 716/12 |
| 2005/0102125 A1 * | 5/2005 | Tseng ............................. | 703/14 |
| 2007/0186199 A1 | 8/2007 | Frederikcson | |
| 2008/0218208 A1 | 9/2008 | Lewis et al. | |

* cited by examiner

*Primary Examiner* — Jack Chiang
*Assistant Examiner* — Brian Ngo
(74) *Attorney, Agent, or Firm* — Weaver Austin Villeneuve and Sampson LLP

(57) ABSTRACT

Mechanisms are provided to improve maximum operating frequency in an integrated circuit. Optimization may be performed during a route phase of a compilation process performed to generate a configuration of the integrated circuit. In some instances, useful clock skew is automatically determined and clock connectivity is rewired on a per-integrated circuit block (per-LAB) basis during the route phase.

20 Claims, 9 Drawing Sheets

METHODS AND SYSTEMS FOR IMPROVING A MAXIMUM OPERATING FREQUENCY OF AN INTEGRATED CIRCUIT DURING A ROUTE PHASE

FIELD OF THE INVENTION

The present disclosure generally relates to integrated circuits and other devices of that general type. More particularly, the present disclosure relates to methods and systems for improving operating frequency of an integrated circuit, such as a programmable logic device (PLD), a structured application specific integrated circuit (ASIC), or a gate array.

BACKGROUND

Programmable logic devices (PLDs) are typically made up of input/output (I/O) resources, interconnect resources, logic resources, and memory resources. PLDs may also contain other resources, such as digital signal processing blocks ("DSPs") and other embedded processing resources. The logic resources typically include logic elements (LEs) grouped in clusters that are sometimes referred to as logic array blocks (LABs). The memory resources typically include embedded memory blocks (EMBs) of various sizes.

As technology progresses, demand for faster PLDs increases. However, operation of PLDs cannot be easily manipulated to satisfy the demand for faster PLDs.

SUMMARY OF THE INVENTION

Mechanisms are provided to improve maximum operating frequency in an integrated circuit. Optimization may be performed during a route phase of a compilation process performed to generate a configuration of the integrated circuit. In some instances, useful clock skew is automatically determined and clock connectivity is rewired on a per-block basis during the route phase. The block may be a logic array block (LAB), a digital signal processor block (DSP block), a random access memory (RAM) block, or an input/output block (I/O block).

BRIEF DESCRIPTION OF THE DRAWINGS

The systems and techniques may best be understood by reference to the following description taken in conjunction with the accompanying drawings, which illustrate specific embodiments of the present invention.

DETAILED DESCRIPTION

Figure 1:
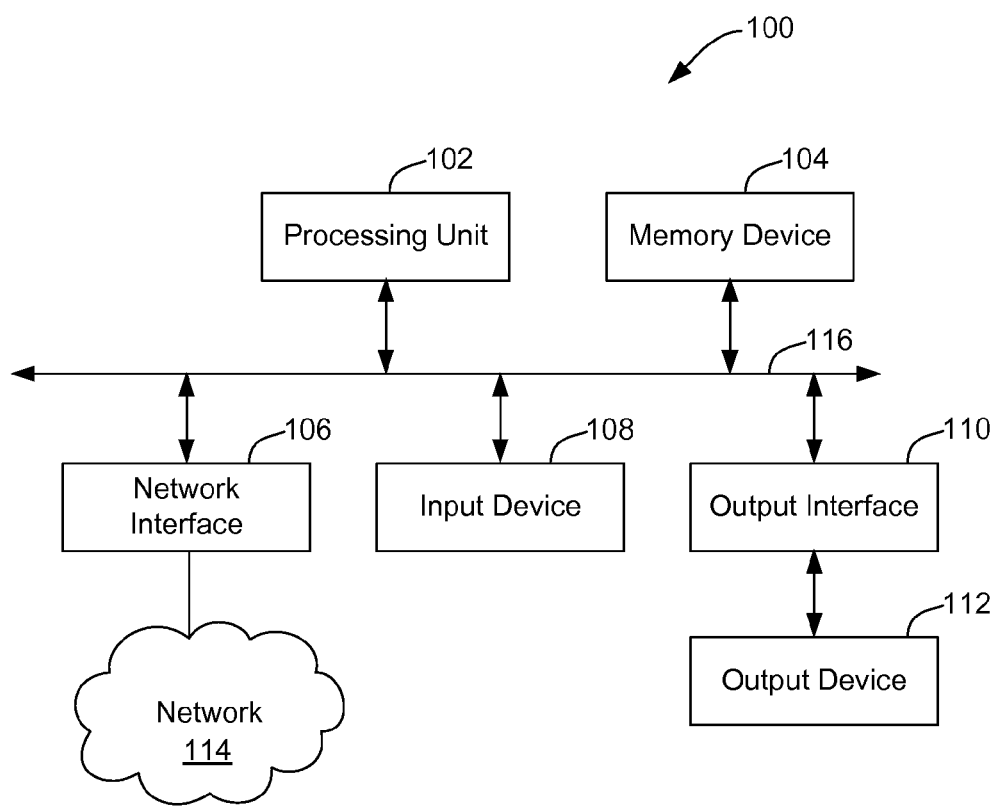
FIG. 1 is a block diagram of an embodiment of a system for improving a maximum operating frequency of an integrated circuit during a route phase.

FIG. 1 is a block diagram of an embodiment of a system 100 for improving a maximum operating frequency of an integrated circuit during a route phase. System 100 includes a processing unit 102, a memory device 104, a network interface 106, an input device 108, an output interface 110, and an output device 112. Processing unit 102 may be a central processing unit 102 (CPU), a microprocessor, a floating point coprocessor, a graphics coprocessor, a hardware controller, a microcontroller, a programmable logic device (PLD) programmed for use as a controller, a network controller, or other processing unit. Memory device 104 may be a random access memory (RAM), a read-only memory (ROM), or a combination of RAM and ROM. For example, memory device 104 includes a computer-readable medium, such as a floppy disk, a ZIP™ disk, a magnetic disk, a hard disk, a compact disc-ROM (CD-ROM), a recordable CD, a digital video disc (DVD), or a flash memory. Memory device 104 stores the techniques, described herein, for improving a maximum operating frequency of an integrated circuit during a route phase.

Network interface 106 may be a modem or a network interface card (NIC) that allows processing unit 102 to communicate with a network 114, such as a wide area network (WAN) or a local area network (LAN). Processing unit 102 may be connected via a wireless connection or a wired connection to network. Examples of the wireless connection include a connection using Wi-Fi protocol or a WiMax protocol. The Wi-Fi protocol may be an IEEE 802.11, IEEE 802.11a, IEEE 802.11b, IEEE 802.11 g, or IEEE 802.11i protocol. Examples of input device 108 include a mouse, a keyboard, a stylus, or a keypad. Output device 112 may be a liquid crystal display (LCD) device, a plasma display device, a light emitting diode (LED) display device, or a cathode ray tube (CRT) display device. Examples of output interface 110 include a video controller that drives output device 112 to display one or more images based on instructions received from processing unit 102. Processing unit 102 access the techniques, described herein, for improving a maximum operating frequency of an integrated circuit, from memory device 104 or from a remote memory device (not shown), similar to memory device 104, via network, and executes the techniques. Processing unit 102, memory device 104, network interface 106, input device 108, output interface 110, and output device 112 communicate with each other via a bus 116. In another embodiment, system 100 may not include input device 108 and/or network interface 106. For example, system 100 may communicate via network interface 106 with an input device located remotely.

Figure 2:
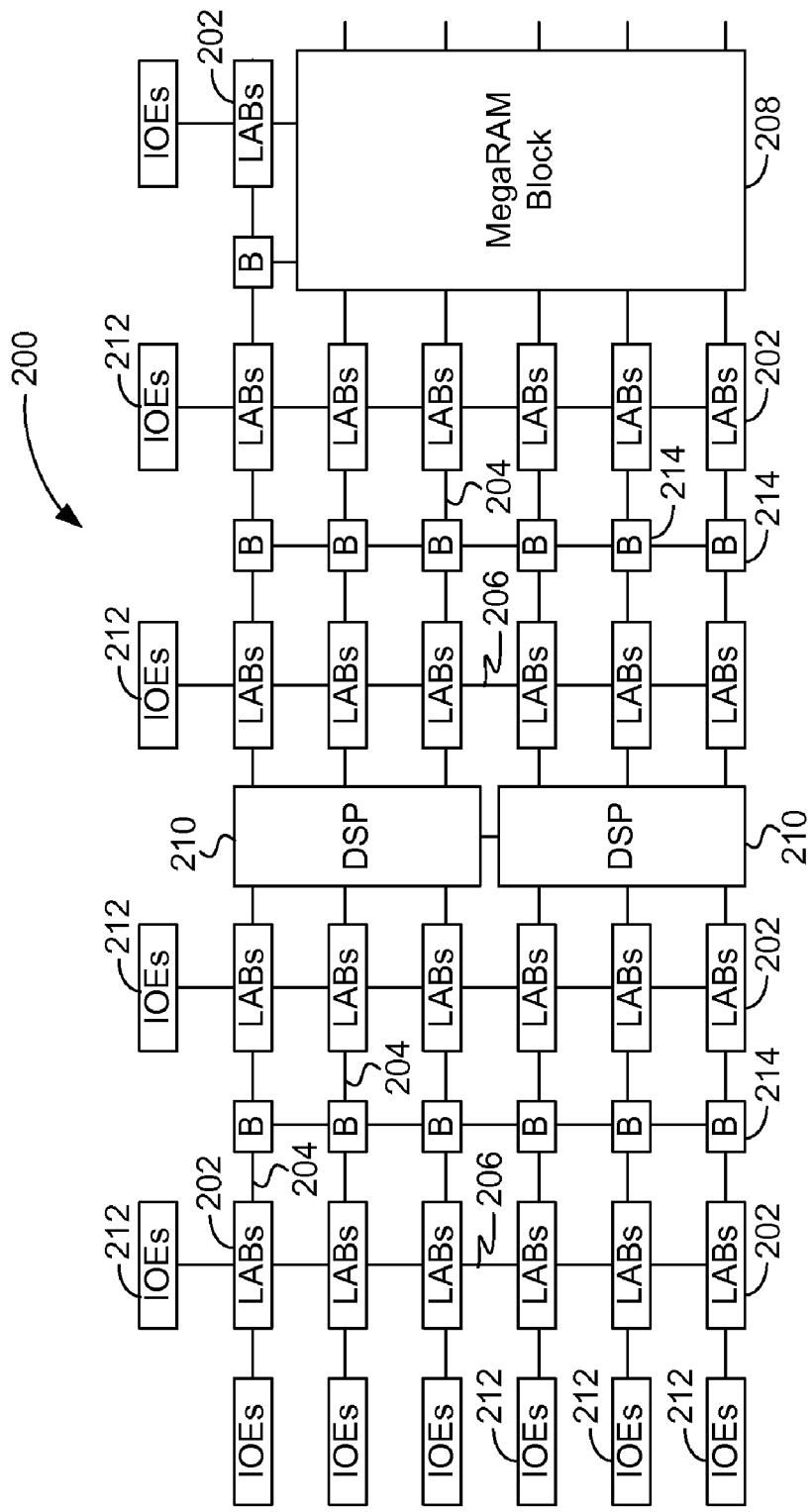
FIG. 2 is a block diagram of an embodiment of a programmable logic device (PLD) that is configured by using system of FIG. 1.
Figure 3:
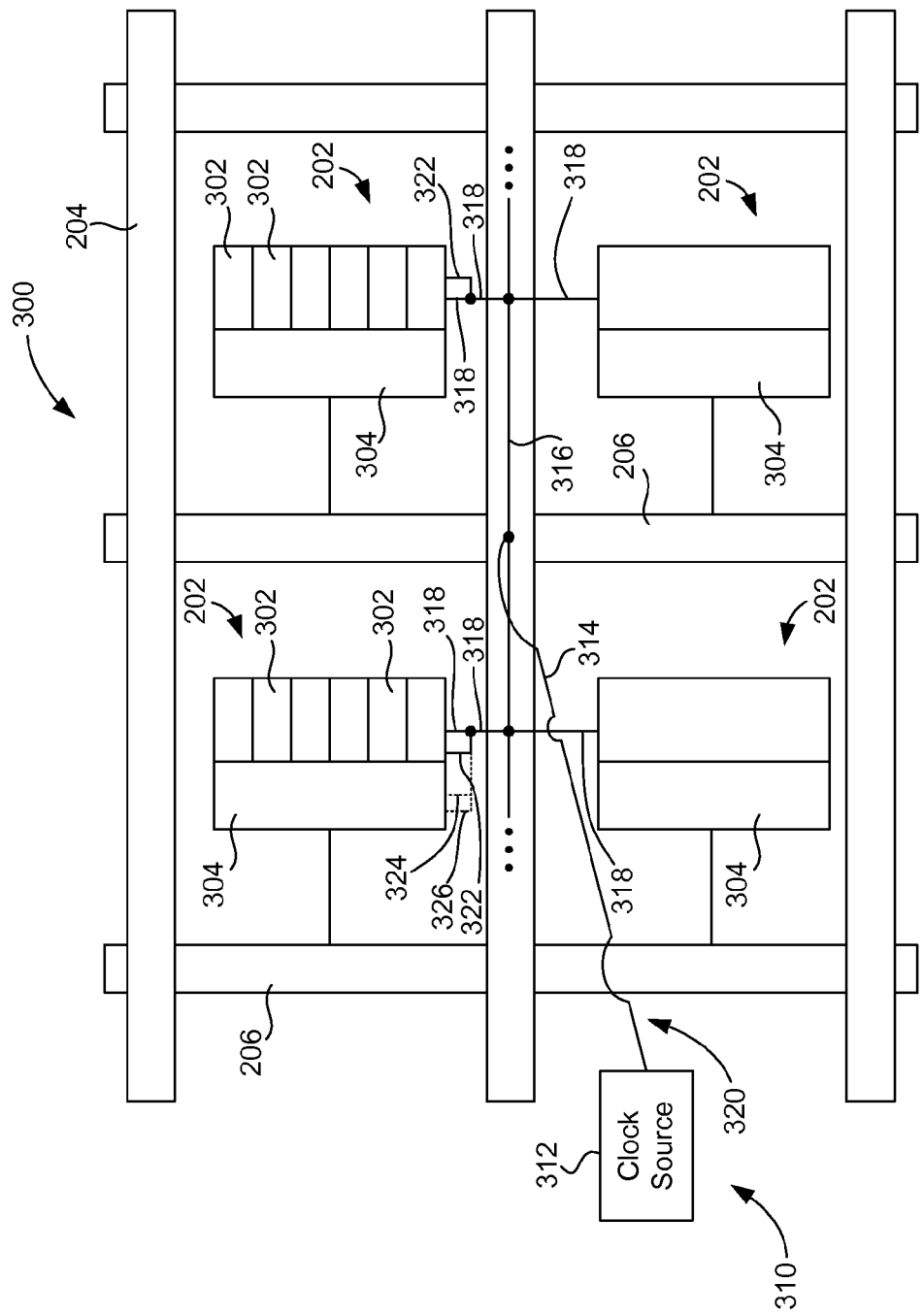
FIG. 3 is a block diagram of an embodiment of at least a portion of the PLD of FIG. 2.

FIG. 2 is a block diagram of an embodiment of a programmable logic device (PLD) 200 that is configured by using system of FIG. 1. FIG. 3 is a block diagram of an embodiment of at least a portion 300 of PLD 200. PLD 200 includes a two-dimensional array of programmable logic array blocks (LABs) 202 that are interconnected by a network of a plurality of row interconnects 204 and a plurality of column interconnects 206 of varying length and speed. For the purpose of avoiding clutter in FIG. 2, not all LABs 202 are numbered 202. LABs 202 include multiple logic elements (LEs 302) (shown in FIG. 3). PLD 200 also includes a distributed memory structure including a plurality of RAM blocks of varying sizes provided throughout the array. The RAM blocks include, for example, a MegaRAM block 208 and/or a RAM block, which stores less information than the MegaRAM block. PLD 200 further includes a plurality of digital signal processing (DSP) blocks 210 that can implement, for example, multipliers, add features, and/or subtract features. A plurality of input/output (I/O) elements (IOEs) 212 located around the periphery of PLD 200 support numerous single-ended and differential I/O standards. PLD 200 further includes a plurality of buffers (Bs) 214 that connect LABs 202. Buffers 214 may be used to store data that is transferred between LABs 202.

Referring to FIG. 3, PLD 200 includes a plurality of logic elements (LEs) 302, a plurality of sets 304 of LAB lines, and LABs 202. LEs 302 of LAB 202 are connected to each other via set 304 of LAB lines. The LAB lines of set 304 within LAB 202 connect to LEs 302 of the LAB 202. A clock distribution network 310, which may be an H-tree, includes a clock source 312 connected to an overlay connection 314 that overlays row interconnects 204 and column interconnects 206. Overlay connection 314 overlays and is not connected to column interconnects 206 and row interconnects 204. The clock distribution network 310 further includes a clock connection 316, from which a plurality of extensions 318 branch out to connect to LAB 202 to supply a clock signal 320 from clock source 312 to LAB 202. For example, extension 318 extends to connect to LAB 202 and provides clock signal 320 supplied from clock source 312 to LAB 202. Clock signal 320 travels from clock source 312 via overlay connection 314 and clock connection 316 to extension 318. After a split, described below, a delay is added to clock signal 320 and the delayed clock signal is supplied to LAB 202 via a branch connection 322. Branch connection 322 may connect directly with a circuit element, such as a register, within LE 302 of LAB 202, without being connected to a LAB line of set 304 of the LAB. In another embodiment, a plurality of branch connections 324 and 326 shown in dotted lines are connected via one or more LAB lines of set 304 to a circuit element, such as a register, within LE 302. Any of branch connections 324 and 326 may be used instead of branch connection 322. Clock signal 320 is delayed and supplied via branch connection 322 to LAB 202 and is supplied without the delay via extension 318.

Clock source 312 may be a crystal oscillator, may be a crystal oscillator coupled with a phase locked loop (PLL), or the clock source may be generated by a group of logic elements. The clock distribution network 310 is a global clock network in which clock source 312 supplies clock signal 320 globally to PLD 200 via at least one overlay connection 314, at least one clock connection 316, and at least one extension 318 and/or any of at least one branch connection 322, at least one branch connection 324, and at least one branch connection 326 to all circuit elements, such as LABs 202, DSP blocks 210, the RAM blocks, and/or buffers 214 of PLD 200. In another embodiment, a global clock distribution network 310 includes clock source 312 that provides a clock signal 320 to LAB 202 and no other LABs 202.

In another embodiment, system 200 includes any number of LABs 202. In yet another embodiment, PLD 200 does not include buffers 214 and data is directly transferred between LABs 202 without being stored in the buffers. In still another embodiment, buffers 214 are included for storage of data transferred between some of the LABs 202 and data is directly transferred between the remaining LABs 202 without being stored in buffers 214. In still another embodiment, clock source 312 is connected to any of LEs 302 via one or more row interconnects 204, one or more specialized delay elements, one or more column interconnects 206, and/or one or more LAB lines of set 304. In yet another embodiment, clock source 312 is connected to any of LEs 302 via connections other than row interconnect 204, column interconnect 206, and a LAB line of set 304. It is further noted that in various embodiments, a LAB line of set 304 of LSB 202 is an intermediate routing resource between the global clock network and LEs 302 of the LAB.

Figure 4:
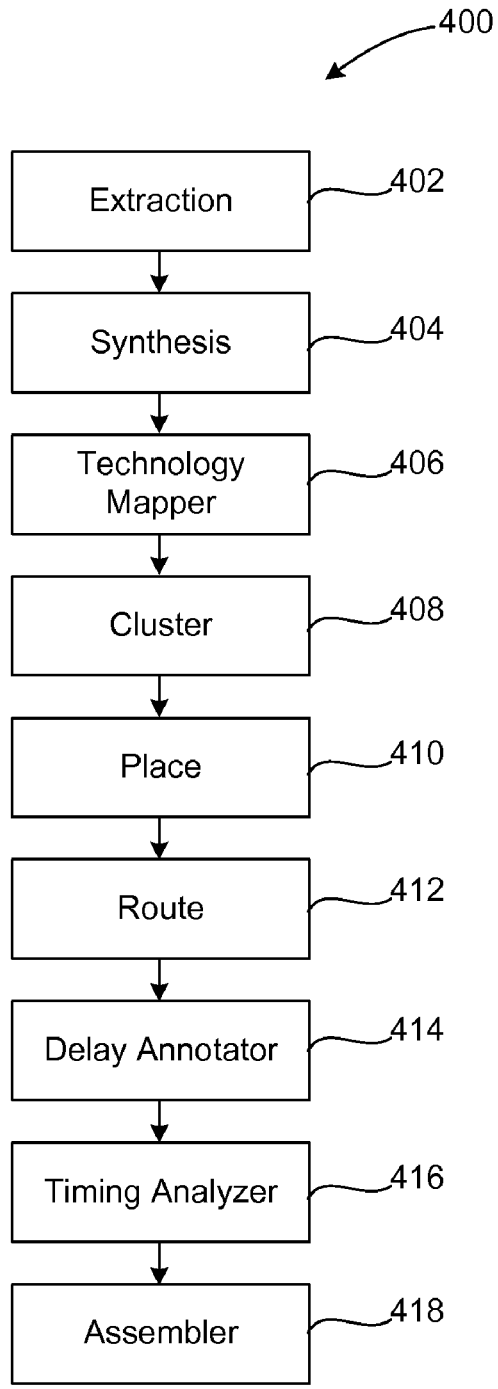
FIG. 4 is a block diagram of an embodiment of a technique for improving a maximum operating frequency of the integrated circuit during the route phase.

FIG. 4 is a block diagram of an embodiment of a technique 400 for improving a maximum operating frequency of an integrated circuit during a route phase. Technique 400 is a compilation process that includes an extract phase 402, a synthesis phase 404, a technology mapping phase 406, a cluster phase 408, a place phase 410, a route phase 412, a delay annotator phase 414, a timing analysis phase 416, and an assembler phase 418. Processing unit 102 accesses technique 400 stored within memory device 104 or the remote memory device, and executes the technique.

Processing unit 102 executes the compilation process to convert a user design expressed, for example, as a Hardware Description Language (HDL) by a user, into a programmable device configuration to configure PLD 200 to implement the user design. Processing unit 102 executes extract phase 402 to convert the user design into a register transfer layer description.

Processing unit 102 executes synthesis phase 404 to convert the register transfer layer description of the user design into a set of logic gates. Processing unit 102 executes technology mapping phase 406 to map the set of logic gates into a set of atoms, which are irreducible constituents of the user design. The atoms may correspond to groups of logic gates and other components of the user design matching the capabilities of LEs 302 or other functional blocks of PLD 200. The user design may be converted into any number of different sets of atoms, depending upon the underlying hardware of PLD 200 used to implement the user design.

Processing unit 102 further executes cluster phase 408 to group related atoms together into clusters. Processing unit 102 also executes place phase 410 to assign clusters of atoms to locations on PLD 200. Processing unit 102 executes route phase 412 to determine a configuration of a configurable switching circuit of PLD 200 used to connect the atoms implementing the user design. Processing unit 102 executes delay annotator phase 414 to determine a plurality of signal delays, such as data delays, for the set of atoms and their associated connections in the configurable switching circuit by using a timing model of PLD 200. Processing unit 102 executes timing analysis phase 416 to determine whether the implementation of the user design in PLD 200 will meet a plurality of long-path and short-path timing constraints specified by the user via input device 108.

Processing unit 102 executes assembler phase 418 to generate configuration information specifying the configuration of PLD 200 implementing the user design, including the configuration of each LE 302 used to implement the user design and the configuration of the configurable switching circuit used to connect the LEs 302. Processing unit 102 executes assembler phase to write the configuration information to a configuration file, which can be stored within memory device 104 and can then be used to configure PLD 200 to implement instances of the user design.

Figure 5:
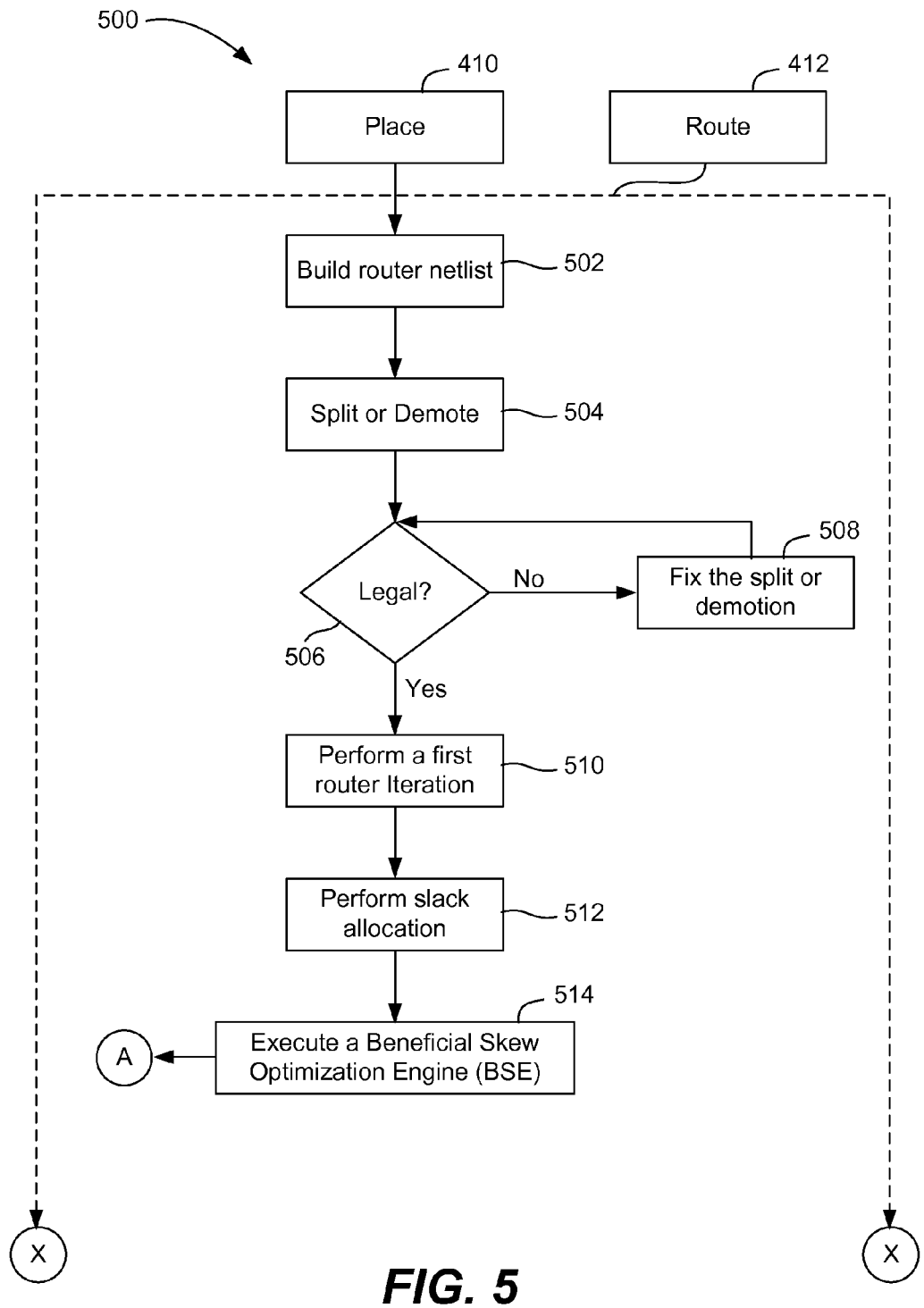
FIG. 5 is a block diagram of an embodiment of a technique for improving a maximum operating frequency of the integrated circuit during the route phase.
Figure 6:
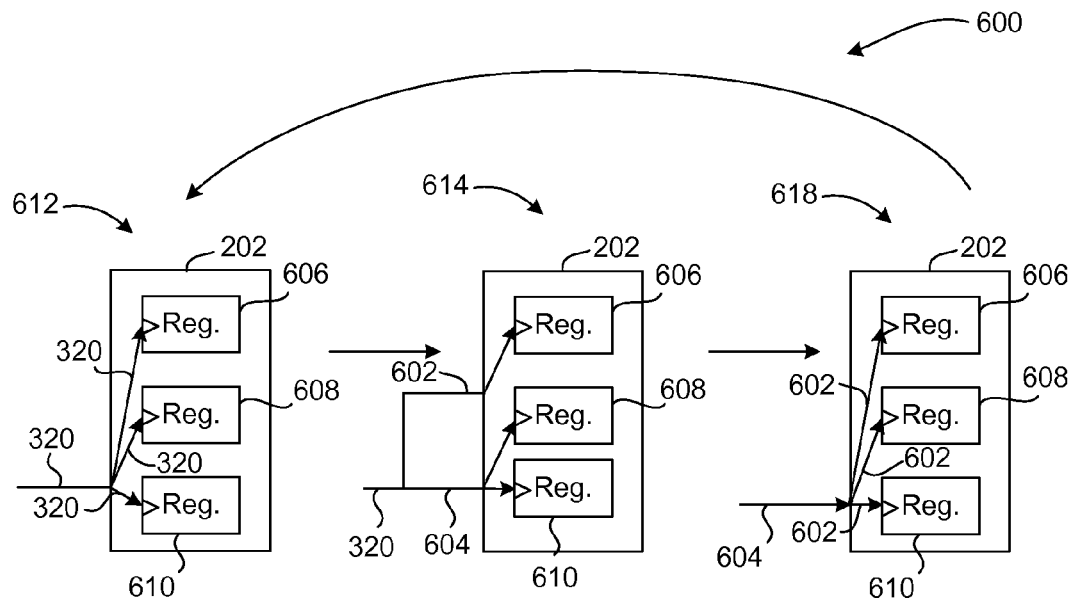
FIG. 6 is a block diagram of an embodiment of a system used to illustrated technique of FIG. 5.
Figure 7:
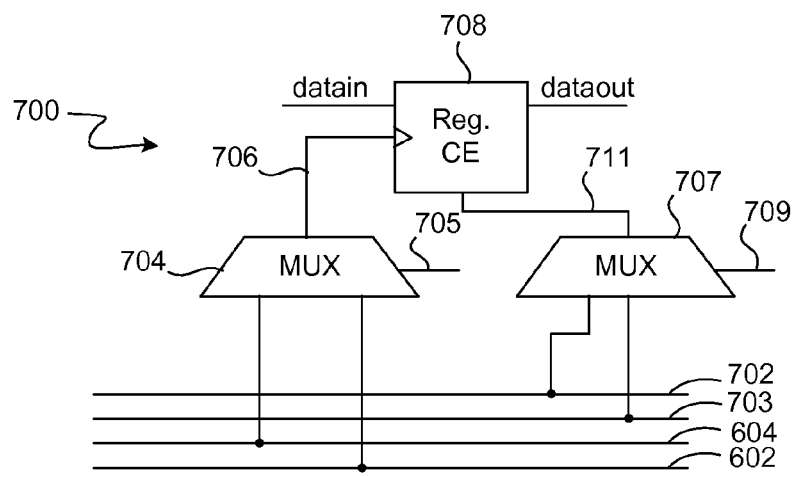
FIG. 7 is a block diagram of an embodiment of a system used to illustrate the technique of FIG. 5.
Figure 8:
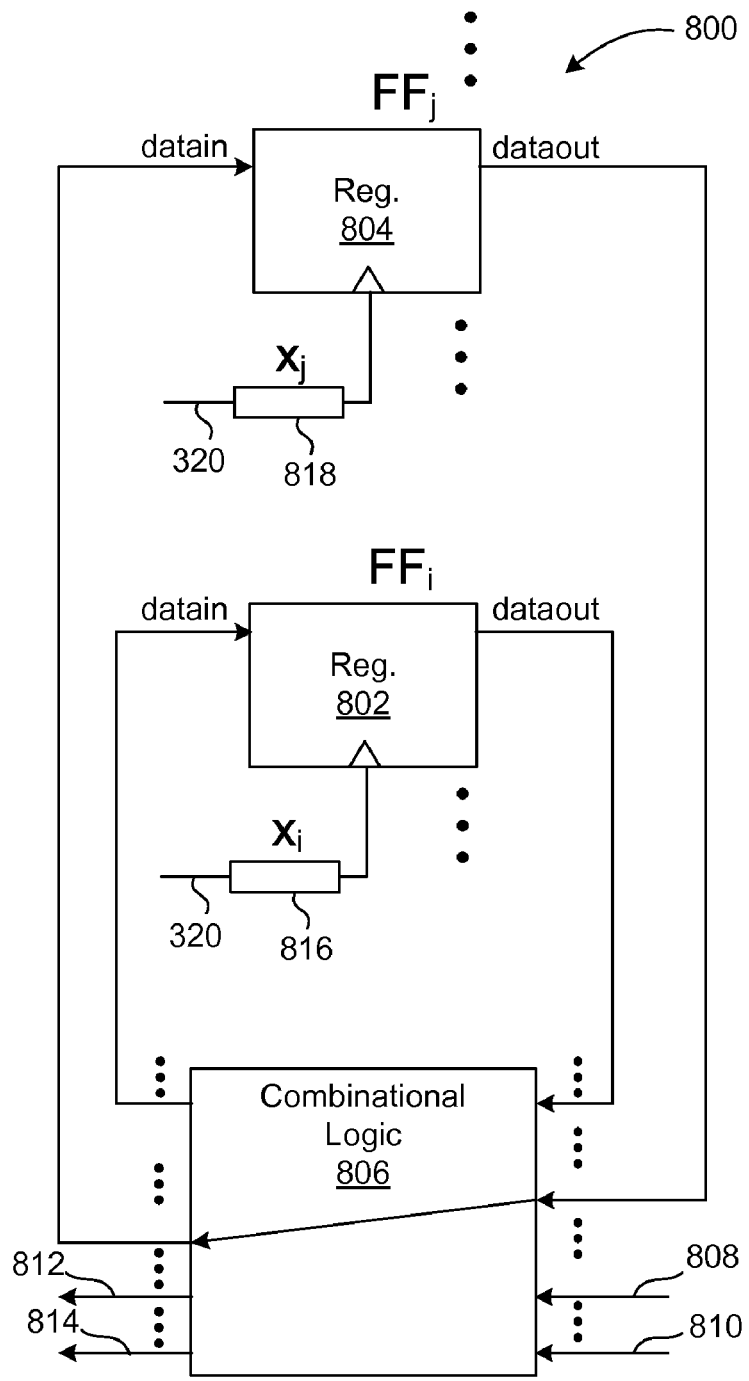
FIG. 8 is a block diagram of an embodiment of a system used to illustrated the technique of FIG. 5.
Figure 9:
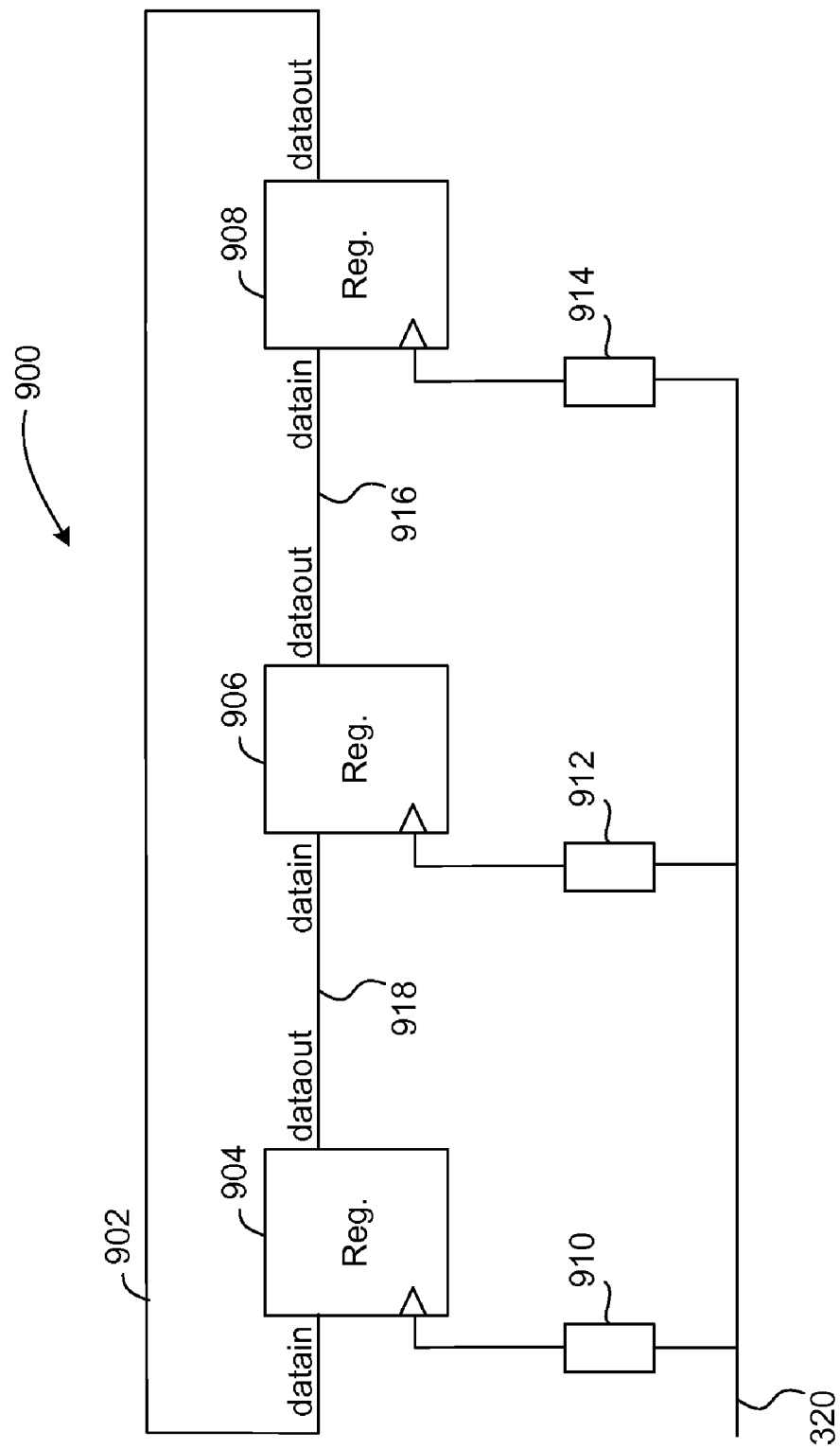
FIG. 9 is a block diagram of an embodiment of a system used to illustrated the technique of FIG. 5.

FIG. 5 is a block diagram of an embodiment of a technique 500 for improving a maximum operating frequency of an integrated circuit during a route phase. FIG. 6 is a block diagram of an embodiment of a system 600 used to illustrated technique 500 of FIG. 5, FIG. 7 is a block diagram of an embodiment of a system 700 used to illustrated technique 500 of FIG. 5, FIG. 8 is a block diagram of an embodiment of a system 800 used to illustrated the technique 500 of FIG. 5, and FIG. 9 is a block diagram of an embodiment of a system 900 used to illustrated the technique of FIG. 5. System 800 is a block diagram of an exemplary circuit that can be implemented in PLD 200.

During route phase 412, processing unit 102 builds 502 a route netlist. The route netlist includes a list of designations of a plurality of circuit elements, such as LEs 302, LABs 202, registers, terminals of the LABs 202, and terminals of the LEs 302. The terminals of LABs 202 include inputs and/or output connections of the LABs 202. The terminals of LEs 302 include inputs and/or output connections of the LEs 302. As an example, the route netlist includes

CS, LAB1, T1
CS, LAB2, T2
CS, LAB3, T3 where CS designates clock source 312, LAB1, LAB2, and LAB3 are three separate LABs 202 of PLD 200, and T1 represents a terminal that is connected to LAB1, T2 represents a terminal that is connected to LAB2, and T3 represents a terminal that is connected to LAB3.

Further, during route phase 412, processing unit 102 splits or demotes 504 clock signal 320 supplied by clock source 312 by executing a beneficial skew infrastructure (BSI) engine, which is a software module. Clock signal 320 may be represented in the route netlist. Referring to FIG. 6, processing unit 102 splits clock signal 320 into a delayed clock signal 602 and an undelayed clock signal 604. As an example, undelayed clock signal 604 is supplied to LAB 202 via extension 318 and delayed clock signal 602 is supplied to LAB 202 via branch 322, 324, or 326. Undelayed clock signal 604 may be clock signal 320 without delay or clock signal 320 having a clock delay before an additional clock delay is applied. Clock signal 320 is supplied to LAB 202 that includes a set of registers 606, 608, and 610, each of which may be a D flip-flop or a T flip-flop. Before splitting, clock signal 320 is supplied to a clock input of each register 606, 608, and 610. After splitting, processing unit 102 supplies delayed clock signal 602 to clock input of top register 606 and undelayed clock signal 604 to the two clock inputs of two bottom registers 608 and 610 of LAB 202. LAB 202 that receives clock signal 320 is in an initial stage 612 and LAB 202 that receives delayed clock signal 602 and undelayed clock signal 604 after a split of clock signal 320 is in an intermediate stage 614. In addition to determining whether to split or demote clock signal 320, processing unit 102 also determines whether to split a clock enable signal 702 and/or other control signals related to the clock signal 320. Clock enable signal 702 is applied to PLD 200 and enables an application of clock signal 320. For example, clock signal 320 is not applied to PLD 200 if clock enable signal 702 is not enabled and is applied to PLD 200 if clock enable signal 702 is enabled.

Processing unit 102 determines to split clock enable signal 702 and/or other control signals related to clock signal 320 upon determining to split clock signal 320. For example, processing unit 102 determines to use a LAB line of set 304 to communicate a clock enable signal 703 used to enable delayed clock signal 602. On the other hand, upon determining not to split clock signal 320, processing unit does not split clock enable signal 702.

Referring back to FIG. 5, upon determining that clock signal 320 cannot be split, processing unit 102 determines whether to demote clock signal 320. For example, processing unit 102 determines that all resources, such as the LAB lines of set 304, internal resources, and/or any of branches 322, 324, and 326, connected to LAB 202 are consumed by control signals and/or data signals, and determines not to split clock signal 320. In this example, clock signal 320, if split, is delayed and the delayed clock signal is distributed via branch 322, 324, or 326 to LAB 202. Further, in this example, upon determining to demote clock signal 320, processing unit 102 determines to add a clock delay to clock signal 320 and supplies the clock via extension 318 connected to LAB 202 and adds the clock delay to the extension 318. In this example, processing unit 102 demotes clock signal 320 by adding the clock delay instead of splitting clock signal 320. Examples of the internal resources include multiplexers 704 and 707.

Processing unit 102 executes 506 to determine whether the split or demotion is legal. As an example, referring to FIG. 6, processing unit 102 determines whether all the resources that are connected to LAB 202 and that can be used to communicate delayed clock signal 602 to register 708 are occupied with communicating other signals, such as control and/or data signals. As another example, processing unit 102 determines whether demotion of two global clock signals is legal. In this example, processing unit 102 determines whether one of the two global clock signals cannot be demoted. Processing unit 102 determines that one of the two global clock signals cannot be demoted by determining that all the resources, such as the LAB lines of set 304, extensions 318, internal resources, and/or any of branches 322, 324, and 326, that can be used to generate a clock delay used to demote the global clock signal 320 are used to transfer a control signal and/or data signal.

A multiplexer 704 is controlled via a select input 705 to provide as an output 706 delayed clock signal 602 or undelayed clock signal 604. Further, another multiplexer 707 is controlled via a select input 709 to provide as an output 711 clock enable signal 702 or clock enable signal 703. Output 706 is received at a clock input of a register 708, which is an example of register 606, 608, or 610 (FIG. 6) of LAB 202. Further, output 711 is received at a clock enable input of register 708.

Referring back to FIG. 5, upon determining that split or demotion is illegal, processing unit 102 executes 508 to fix the split or demotion. For example, referring to FIG. 7, upon determining that the resources used to transfer control or data signals cannot be used to communicate delayed clock signal 602 to register 708, processing unit 102 determines that the split or demotion is illegal and upon determining that the split or demotion is illegal, processing unit 102 fixes the split or demotion by promoting the split or demotion. Processing unit 102 promotes the split or demotion by reverting PLD 200 to initial stage 612 (shown in FIG. 6) from intermediate stage 614. For example, processing unit 102 may promote the split by freeing one or more LAB lines of set 304 by designating the one or more LAB lines as available for communicating signals other than delayed clock signal 602. As another example, processing unit 102 fixes the demotion by removing a clock delay applied to extension 318 and by designating the extension as free for communicating clock signal 320.

Referring to FIG. 5, upon determining that split or demotion is legal, processing unit 102 performs 510 a first router iteration during route phase 412. Processing unit 102 programmably interconnects various circuit elements of PLD 200 to perform the first router iteration. For example, processing unit 102 performs the first router iteration to programmably interconnect clock source 312 with LAB 202 and/or to programmably interconnect LAB 202 in top left column of FIG. 3 with LAB 202 in bottom right column of FIG. 3. As another example, processing unit 102 interconnects various circuit elements of PLD 200 to improve a maximum operating frequency of PLD 200. The shorter a connection between two circuit elements of PLD 200, the faster the operation of PLD 200 and the higher a maximum operating frequency of PLD 200. Processing unit 102 also determines a plurality of routing delays, which are data delays, between connections of various circuit elements of PLD 200 during the first router iteration.

Referring to FIG. 8, system 800 is an example of PLD 200. System includes 800 a plurality of registers 802 and 804, Each register 802 and 804 may be a T flip-flop or a D flip-flop. Register 802 is designated as $FF_i$ and register 804 is designated as $FF_j$, where $i \ne j$, and i is an integer ranging from 1 to N and j is an integer ranging from 1 to N. Registers $FF_i$ is located in a different LAB 202 than LAB 202 including register $FF_j$. System 800 further includes a combinational logic circuit 806. In another embodiment, combinational logic circuit 806 includes a plurality of gates, such as an AND gate, an OR gate, a NAND gate, or a combination of the gates. Combinational logic circuit 806 receives a set of primary inputs 808 and 810 and outputs a set of primary outputs 812 and 814. An example of a primary input is a bit source that outputs a bit having a value of 0 or 1. Register 802 is applied a clock delay 816, such as $x_i$, and register 804 is applied a clock delay 818, such as $x_j$. A clock delay may also be referred to as clock skew. Each clock delay 816 and 818 receives clock signal 320 from clock source 312.

Processing unit 102 determines a set of data delays that do not violate a set of timing constraints including a short-path timing constraint and a long-path timing constraint. Each timing constraint is specific to a particular connection of PLD 200 or all connections of the PLD having the same timing constraint. A connection is a coupling between a circuit element, such as a register or a node, of PLD 200 and another circuit element of PLD 200. The node may be a multiplier or an adder. The user specifies all timing constraints for all connections of PLD 200 via input device 108.

Referring back to FIG. 5, processing unit 103 further performs 512 slack allocation during route phase 412 to determine a plurality of clock delays $x_{i1}$ and $x_{j1}$ from the data delays. The clock delay $x_{i1}$ is applied to register 802 and the clock delay $x_{j1}$ is applied to register 804. The clock delay $x_{i1}$ is applied to the register $FF_i$ and the clock delay $x_{j1}$ is applied to the register $FF_j$. Clock delay $x_{i1}$ is an example of clock delay 816 and clock delay $x_{j1}$ is an example of clock delay 818.

Processing unit 102 performs 512 slack allocation to improve a maximum operating frequency of PLD 200. For example, with reference to FIG. 9, processing unit 102 determines that a first operating frequency of system 900 is P megahertz (MHz) if a data delay of a connection 902 is Q nanoseconds (ns). In this example, P is an inverse of Q. Further, in this example, processing unit 102 determines that by adding a clock delay of R ns, such as a clock delay 910, to a register 904, the first operating frequency increases to a second operating frequency of S MHz. Processing unit 102 determines S by applying 1/(Q−R). In this example, processing unit 102 determines to apply the clock delay of R ns to register 904. R is an example of $x_{i1}$ or $x_{j1}$, and P, Q, R, and S are real numbers.

Processing unit 102 performs 512 slack allocation by considering whether clock signal 320 is demoted or split. For example, if clock signal 320 is demoted and supplied to LAB 202, processing unit 102 determines that all registers within the LAB receive the same demoted clock signal during the performance of slack allocation. In this example, if clock signal 320 is split, no such determination that all registers within LAB 202 receive the same clock signal is made during the performance of slack allocation.

Processing unit 102 further executes 514 a beneficial skew optimization engine (BSE) to determine the clock delays $x_i$ and $x_j$ for PLD 200 and verifies the set of clock delays $x_{i1}$ and $x_{j1}$, that are determined by performing 512 slack allocation. As an example, to execute 514 the BSE, processing unit 102 determines the clock delays $x_i$ and $x_j$ by applying:

$$x_i + d_{ij,max} \le T + x_j - \mu_{Tsu} \text{ for } i,j=1,\ldots,n \qquad (1)$$

$$x_i + d_{ij,min} \ge x_j + \mu_{Th} \text{ for } i,j=1,\ldots,n \qquad (2)$$

$$x_i \ge 0 \text{ for } i=1,\ldots,n$$

and minimizing a clock period T of clock signal 320, where $\mu_{Tsu}$ is an amount of setup time that data received from register $FF_i$ is constrained to be stored by register $FF_j$ before register $FF_j$ receives clock signal 320 with clock delay $x_j$, $\mu_{Th}$ is an amount of hold time that data received from register $FF_i$ is constrained to be stored by register $FF_j$, after register $FF_j$ clock signal 320 with clock delay $x_j$, $d_{ij,max}$ is a maximum data delay between registers 802 and 804, and $d_{ij,min}$ is a minimum data delay between registers 802 and 804. The user may specify the setup and hold times, used in equations (1) and (2) via input device 108 or the setup and hold times are generated by other techniques. Processing unit 102 determines the minimum data delay $d_{ij,min}$ and the maximum data delay $d_{ij,min}$ used in equations (1) and (2) to satisfy the long-path and short-path timing constraints. Processing unit 102 minimizes the clock period T by applying equations (1) and (2) to output $x_i$ and $x_j$. In applying equations (1) and (2), processing unit 102 limits $x_i$ to be greater than or equal to zero to ensure that clock delay $x_i$ is positive. This example describes a speed approach.

As another example, to execute 514 the BSE, processing unit 102 determines the clock delays $x_i$ and $x_j$ by applying:

$$x_i + d_{ij,max} \le T + x_j - \mu_{Tsu} - M \text{ for } i,j=1,\ldots,n \qquad (3)$$

$$X_i + d_{ij,min} \ge x_j + \mu_{Th} + M \text{ for } i,j=1,\ldots,n \qquad (4)$$

$$x_i \ge 0 \text{ for } i=1,\ldots,n$$

and maximizing M, which is a safety margin. The user specifies the period T in equations (3) and (4) via input device 108. The user may specify the setup and hold times, used in equations (3) and (4) via input device 108 or the setup and hold times are generated by other techniques. In applying equations (3) and (4), processing unit 102 limits $x_i$ to be greater than or equal to zero to ensure that clock delay $x_i$ is positive. Processing unit 102 determines the minimum data delay $d_{ij,min}$, and the maximum data delay $d_{ij,max}$ used in equations (3) and (4) to satisfy the long-path and short-path timing constraints. This example describes a safety approach. The safety approach maximizes the margin M, which is a difference between a sum $x_i + d_{ij,max}$ and another sum $x_j \mu_{Th}$. By executing the speed approach, processing unit 102 may return $x_i$ and $x_j$ with zero short-path slack, i.e., $x_i + d_{ij,min} = x_j + \mu_{Th}$ for some $i,j=1,\ldots,n$ to minimize the clock period T.

As yet another example, to execute 514 the BSE, processing unit 102 applies:

$$x_i + d_{ij,max} \le T + x_j - \mu_{Tsu} \text{ for } i,j=1,\ldots,n \qquad (5)$$

$$x_i + d_{ij,min} \le x_j + \mu_{Th} + SP_{margin} \text{ for } i,j=1,\ldots n \qquad (6)$$

$$x_i \le 0 \text{ for } i=1,\ldots n$$

to maximize the $SP_{margin}$, which is a short-path timing margin. In applying equations (5) and (6), processing unit 102 limits $x_i$ to be greater than or equal to zero to ensure that clock delay $x_i$ is positive. Processing unit 102 determines the minimum data delay $d_{ij,min}$ and the maximum data delay $d_{ij,max}$ used in equations (5) and (6) to satisfy the long-path and short-path timing constraints. The user may specify the setup and hold times, used in equations (5) and (6) via input device 108 or the setup and hold times are generated by other techniques. The user specifies the $SP_{margin}$ a input device 108. Illustrations of $SP_{margin}$ include 250 picoseconds and 225 picoseconds. This example provides a fixed short-path margin approach. Processing unit 102 determines the clock delays $x_i$ and $x_j$ by applying equations (5) and (6). The speed approach, the safety approach, and the short-path margin approach are linear approaches. The clock period T in equations (7) and (8) is provided by the user via input device 108.

As yet another example, processing unit 102 executes 514 BSE by applying a phase approach, which is represented as:

$$x_i + d_{ij,max} \leq \phi_{ij,setup} \cdot T + x_j - \mu_{Tsu} \text{ for } i,j=1,\ldots n \quad (7)$$

$$x_i + d_{ij,min} \phi_{ij,hold} \cdot T + x_j + \mu_{Th} \text{ for } i,j=1,\ldots,n \quad (8)$$

where $\phi_{ij,setup}$ represents a set-up phase for a setup path between registers 802 and 804, and $\phi_{ij,hold}$ is a hold phase for a hold path between the registers. Processing unit 102 outputs the clock delays $x_i$ and $x_j$ by applying equations (7) and (8). A path between two circuit elements, such as two registers 802 and 804, includes any number of connections between the circuit elements. In applying equations (7) and (8), processing unit 102 limits $x_i$ to be greater than or equal to zero to ensure that clock delay $x_i$ is positive. Processing unit 102 determines the minimum data delay $d_{ij,min}$ and the maximum data delay $d_{ij,max}$ used in equations (7) and (8) to satisfy the long-path and short-path timing constraints. The user may specify the setup and hold times, used in equations (7) and (8) via input device 108 or the setup and hold times are generated by other techniques.

In applying equations (7) and (8), processing unit 102 determines whether a phase of clock signal 320 supplied to register 802 is the same as a phase of clock signal 320 supplied to register 804 and upon determining that the phases are the same, processing unit 102 determines that $\phi_{ij,setup}=1$ and $\phi_{ij,hold}=0$. Further, in applying equations (7) and (8), processing unit 102 determines whether a phase of clock signal 320 applied to register 804 lags by m° a phase applies to register 802, and upon determining that the phase applies to register 804 lags by m°, processing unit 102 determines that $\phi_{ij,setup}=(360°-m°)/360°$ and $\phi ij,hold=-(360°-m°)/360°$. Moreover, in applying equations (7) and (8), processing unit 102 determines whether data is stored at register 804 after an zeroth cycle of clock signal 320 and before an end of $p^{th}$ cycle of clock signal 320, and upon determining that data is stored at register 804 after the zeroth cycle and before an end of the $p^{th}$ cycle of clock signal 320, processing unit 102 determines that $\phi_{ij,setup}=p$ and $\phi_{ij,hold}=0$. The phase approach takes into account clock uncertainties and clock jitters of clock signal 320 provided to registers 802 and 804. The clock uncertainties may occur if clock signal 320 travels far to reach any of registers 802 and 804 than to reach the remaining of the registers.

As another example, processing unit 102 executes 514 BSE by applying a heuristic approach, which is an iterative approach. Processing unit 102 applies the heuristic approach to determine clock delays $x_i$ and $x_j$. In applying the heuristic approach, processing unit 102 determines that $x_i$ and $x_j$ cannot cause a hold violation. For example, referring to FIG. 9, processing unit 102 determines whether clock delay 912 applied to register 906 is greater than a data delay of a connection 916 between register 906 and register 908 and upon determining that the clock delay is greater than the data delay, processing unit 102 determines that a hold violation occurs. On the other hand, in this example, upon determining that clock delay applied to register 906 is less than or equal to the data delay, processing unit 102 determines a hold violation does not occur. In the heuristic approach, a negative amount of delay is not added to clock signal 320 to generate any of clock delays $x_i$ and $x_j$. In the heuristic approach, processing unit 102 determines the clock delay $x_i$ to achieve a slack ratio at a data input or a data output of register $FF_i$ to be less than a set amount specified by the user via input device 108. Further, in the heuristic approach, processing unit 102 determines the clock delay $x_j$ to achieve a slack ratio at a data input or a data output of register $FF_j$ to be less than a set amount specified by the user via input device 108. Further, to perform the heuristic approach, processing unit 102 determines a set of data delays of PLD 200 and in the heuristic approach, processing unit 102 achieves a maximum operating frequency of PLD 200.

Moreover, in the heuristic approach, processing unit 102 continues to iterate to determine the clock delays $x_i$ and $x_j$ until convergence to a certain value of $x_i$ and/or to a certain value of $x_j$ is achieved or until a certain number of iterations are performed. The certain number of iterations is specified by the user via input device 108. Processing unit 102 verifies the clock delays $x_{i1}$, and $x_{j1}$, determined 512 by slack allocation and processing unit 102 verifies the clock delays by comparing the clock delays $x_{i1}$, and $x_{j1}$, with clock delays $x_1$ and $x_j$. Upon determining that $x_{i1}$ is within a certain range, specified by the user via input device 108, of $x_i$, processing unit 102 determines to use $x_{i1}$, instead of $x_i$ as a clock delay applied to register $FF_i$. On the other hand, upon determining that $x_{i1}$, is not within the certain range, processing unit 102 determines to use $x_i$ instead of $x_{i1}$ as a clock delay applied to register $FF_j$. Similarly, upon determining that $x_j$, is within the certain range, processing unit 102 determines to use $x_j$ instead of $x_{j1}$ as a clock delay applied to register $FF_j$. On the other hand, upon determining that $x_{j1}$ is not within the certain range, processing unit 102 determines to use $x_j$ instead of $x_{j1}$, as a clock delay applied to register $FF_j$.

In executing 514 BSE, processing unit 102 determines whether LAB 202 is critical. For example, processing unit 102 determines a slack ratio of LAB 202 by applying a timing analysis to determine whether the slack ratio is greater than a threshold value. In this example, upon determining that the slack ratio is greater than the threshold value, processing unit 102 determines that LAB 202 is critical. In this example, on the other hand, upon determining that the slack ratio is less than or equal to the threshold value, processing unit 102 determines that LAB 202 is not critical. In various embodiment, other techniques to determine whether LAB 202 is critical can be used.

Upon determining that LAB 202 is not critical, processing unit 102 promotes a split or demoted clock signal by determining to apply undelayed clock signal 604 to LAB 202. The application of undelayed clock signal 604 to LAB 202 is indicated as a final stage 618 in FIG. 6. FIG. 6 shows undelayed clock signal 604 applied globally to LAB 202 by applying undelayed clock signal 604 to all registers 606, 608, and 610 of LAB 202.

In another embodiment, multiplexer 704 is not used to control whether delayed clock signal 602 or undelayed clock signal 604 is output. For example, processing unit 102 changes the route netlist to include that undelayed clock signal 604 that is supplied to register 708 (FIG. 7) be demoted to delayed clock signal 602.

In yet another embodiment, processes 506 and 508 are included within process 504. In still another embodiment, combinational logic circuit 806 receives any number of primary inputs. In another embodiment, processing unit 102 does not execute 514 BSE. In yet another embodiment, execution 514 of BSE by processing unit 102 can be turned on or off on a graphical user interface (GUI) on output device 112. Processing unit 102 does not execute 514 BSE when the user turns off BSE and executes 514 BSE when the user turns on BSE. In another embodiment, LAB 202 includes at least one of registers 606, 608, and 610. For example, LAB 202 does not include register 610 and delayed clock signal 602 is applied to register 606 and undelayed clock signal 604 is applied to register 608.

In various embodiments, processing unit 102 determines to split clock signal 320 to connect the same clock signal to LAB 202 multiple times at the beginning of route phase 412 to provide an opportunity for choosing routing paths to the split clock signals to improve performance of PLD 200 at a later time. Further, in an embodiment, processing unit 102 determines to demote clock signal 320 at the beginning of route phase 412 to route the clock signal using additional resources to create a delayed clock signal and the demotion enables to improve a performance of PLD 200 at a later time during the route phase. Moreover, in various embodiments, the split operation affects connectivity described by the route netlist. It is further noted that in an embodiment, processing unit 102 demotes clock signal 320 to generate a demoted clock signal and the demoted clock signal is applied to only a single register in LAB 202. It is noted that in various embodiments, the phase approach is integrated within the fixed approach, the safety approach, and/or the short-path margin approach. In another embodiment, system 800 includes latches in place of registers 802 and 804.

It is noted that in an embodiment, intermediate stage 614 is a stage that is more desirable compared to final stage 618 and final stage 618 is more desirable compared to initial stage 612. In this embodiment, intermediate stage 614, when applied, maximizes rewiring flexibility. Comparatively, initial stage 612 has no rewiring flexibility. A reason for not transferring from initial stage 612 to intermediate stage 614 is a limited number of resources of PLD 200. In another embodiment, registers $FF_i$ and register $FF_j$ are located within the same LAB 202. In various embodiments, processing unit 102 performs the determination of whether to split or demote clock signal 320 for all LABs 202 of PLD 200. In other various embodiment, processing unit 102 performs the determination of whether to split or demote clock signal 320 for at least one LAB 202 of PLD 200. Moreover, in an embodiment, processing unit 102 performs the first router iteration only after determining whether a split or demotion is legal.

Figure 10:
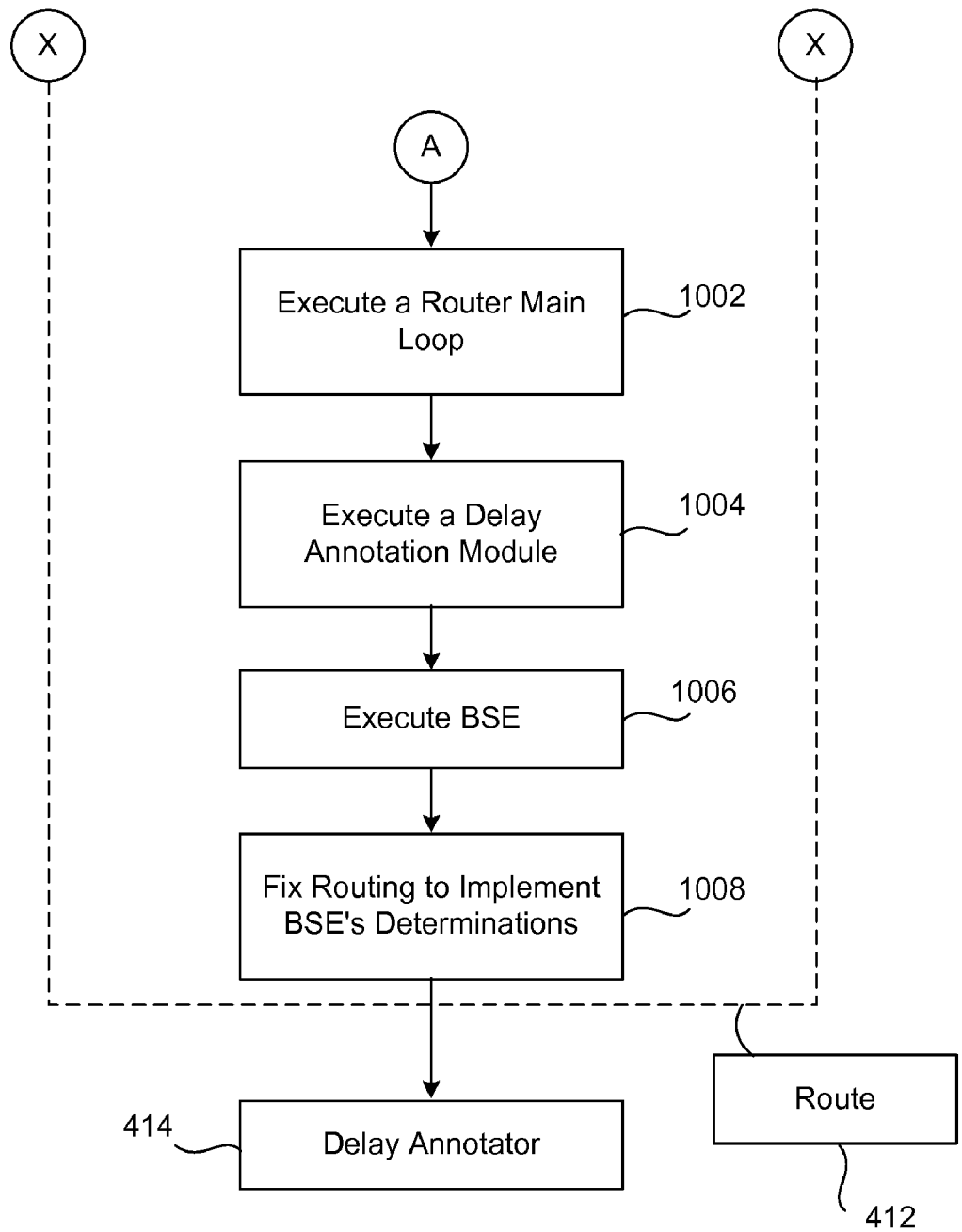
FIG. 10 is a continuation of the flowchart of FIG. 5.

FIG. 10 is a flowchart of an embodiment of technique 500 for improving a maximum operating frequency of a PLD during a route phase. After processing unit 102 determines to promote clock signal 320 that is split or demoted or after determining that LAB 202 is critical, processing unit 102 executes 1002 a router main loop. Processing unit 102 executes 1002 router main loop in a similar manner as that of performing 510 router first iteration. For example, processing unit 102 generates a group of programmable interconnects to supply undelayed clock signal 604 to LAB 202 after promoting a demoted or split clock signal.

Processing unit 102 executes 1004 a delay annotator module to generate a clock delay $x_{i2}$ to be applied to register $FF_i$ and a clock delay $x_{j2}$ to be applied to register $FF_j$ in a similar manner as that of performing 512 slack allocation except that processing unit 102 determines the clock delays based on connections of PLD 200 after the promotion or the determination that LAB 202 is critical. For example, processing unit 102 determines a set of data delays, of connections 902, 916, and a connection 918 (FIG. 9), and the data delays change as a result of the promotion, determines a maximum operating frequency of system 900 from the data delays, and determines the clock delays 910, 912, and a clock delay 914 to increase the maximum operating frequency of system 900 by a pre-defined amount, specified by the user via input device 108.

Processing unit 102 executes 1006 BSE in a similar manner as that of executing 514 BSE (FIG. 5) except that processing unit 102 generates a clock delay $x_{i3}$ applied to register $FF_i$ and a clock delay $x_{j3}$ applied to register $FF_j$ by executing 1006 BSE, determines whether $x_{i3}$ is within the certain range of $x_{i2}$ and whether $x_{j3}$ is within the certain range of $x_{j2}$.

Processing unit 102 communicates, by executing 1006 BSE, whether to implement clock delay $x_{i2}$ or clock delay $x_{i3}$ and whether to implement clock delay $x_{j2}$ or clock delay $x_{j3}$ to the BSI engine. Upon receiving the communication to implement clock delay $x_{i2}$ or clock delay $x_{i3}$ and whether to implement clock delay $x_{j2}$ or to implement clock delay $x_{j3}$, the BSI engine executed by processing unit 102 implements the determination made by BSE by fixing 1008 routing between the circuit elements of PLD 200. For example, the BSI engine executed by processing unit 102 fixes routing between the circuit elements of PLD 200 to implement the clock delay $x_{i2}$ or clock delay $x_{i3}$ and to implement the clock delay $x_{j2}$ or clock delay $x_{j3}$. As another example, processing unit 102 uses programmable logic interconnect to supply delayed clock signal 602 via branch connection 322 to register 708 (FIG. 7). As yet another example, processing unit 102 frees the resources, upon determining, via BSE, that undelayed clock signal 604 and not delayed clock signal 602 is supplied to register 708 (FIG. 7).

In various embodiments, processing unit 102 determines whether LAB 202, referred to as a first LAB, is flagged as reserved by the user. The user may flag LAB 202 are reserved via input device 108. In these embodiments, upon determining that the first LAB is flagged as reserved, processing unit 202 does not apply a clock delay to the first LAB and the clock delay is a delay that is determined using the techniques illustrated in FIGS. 1-10. Moreover, in these embodiments, the clock delay may be applied to any other remaining LABs 202 of PLD 200 that are not flagged as reserved and the clock delay is determined by using the remaining LABs. On the other hand, upon determining that the first LAB is not flagged as reserved, processing unit 202 applies the same clock delay to the first LAB and the remaining LABs of PLD 200.

In one embodiment, upon determining to split clock signal 320 into delayed clock signal 602 and undelayed clock signal 604 and upon determining that clock enable signal 702 used to enable clock signal 320 cannot be split into clock enable signal 702 used to enable delayed clock signal 602 and another clock enable signal 702 used to enable undelayed clock signal 604, processing unit 102 determines not to split clock signal 320. In another embodiment, any number of clock distribution networks are connected to PLD 200. For example, PLD 200 receives two global clock signals via two clock distribution networks and each of the clock distribution networks is the same as clock distribution network 310. In this example, each global clock signal is controlled by a respective clock enable signal.

It is noted that any of the clock delays $x_i$, $x_j$, $x_{i1}$, $x_{i2}$, $x_{i3}$, $x_{j1}$, $x_{j2}$, $x_{j3}$ can be changed by the user via input device 108 or output device 112, which may include a touch screen. For example, the user may change a routing tree or a routing netlist to not implement any of the clock delays $x_i$, $x_j$, $x_{i1}$, $x_{i2}$, $x_{i3}$, $x_{j1}$, $x_{j2}$, and $x_{j3}$. It is further noted that in another embodiment, some of the processes within the flowcharts of FIGS. 4, 5, and 10 can be performed in a different order than that shown or performed simultaneously in parallel. It is further noted that in various embodiments, a register is replaced by a latch. For example, any of registers 606, 608, and 610 are replaced by a latch. Moreover, in various embodiments, the execution of the router main loop may be performed before or after the promotion.

It is noted that although the techniques described herein are described with respect to PLDs, the techniques are applicable to other integrated circuits, such as a structured application specific integrated circuit (ASIC) or a gate array. The gate array may be a field programmable gate array (FPGA). It is further noted that although the techniques herein are described with respect to LABs, the techniques are applicable to other integrated circuit blocks, such as RAM blocks, DSP blocks, and I/O blocks within an integrated circuit.

A technical effect of the herein described systems and techniques includes dynamically improving a maximum operating frequency of PLD 200 during a route phase. Improving a maximum operating frequency of PLD 200 during a route phase saves time and cost. For example, allocating resources before an end of route phase to transfer delayed clock signals saves an effort to reroute after the route phase to transfer the delayed clock signals to a LAB of PLD 200. The saving of effort results in a savings of time and costs.

Although the foregoing systems and techniques have been described in detail by way of illustration and example for purposes of clarity and understanding, it will be recognized that the above described systems and techniques may be embodied in numerous other specific variations and embodiments without departing from the spirit or essential characteristics of the systems and techniques. Certain changes and modifications may be practiced, and it is understood that the systems and techniques are not to be limited by the foregoing details, but rather is to be defined by the scope of the appended claims.

What is claimed is:

1. A method comprising:
during a route phase for generating configuration information for an integrated circuit, the integrated circuit comprising a plurality of circuit elements, determining by using a computer device, whether a block of the integrated circuit is a non-critical block by determining whether a clock delay increases an operating frequency of the integrated circuit by a threshold value, wherein the clock delay is applied to the integrated circuit block;
determining whether to split and/or splitting or demote demoting an initial clock signal to achieve a beneficial clock skew for the block of the integrated circuit;
promoting the split and/or demoted clock signal in response to determining that the integrated circuit block is noncritical block and further in response to determining that said splitting and/or demoting is legal based on a number of resources of the integrated circuit in use, wherein said promoting comprises applying the initial clock signal to the integrated circuit block, wherein the initial clock signal comprises a global non-delayed clock signal; and
interconnecting the plurality of circuit elements such that the first circuit element receives the split and/or demoted initial clock signal in response to determining that said splitting and/or demoting is legal.

2. A method in accordance with claim 1 further comprising:
fixing the split and/or demotion in response to determining that the split and/or or demotion is illegal.

3. A method in accordance with claim 1 further comprising:
routing the initial clock signal via a global clock distribution network;
generating a route netlist comprising a plurality of integrated circuit blocks of the integrated circuit, wherein the plurality of integrated circuit blocks comprises a plurality of logic elements (LEs), wherein the route netlist is configurable to indicate a connection between two LEs of the plurality of LEs, wherein the route phase occurs after a place phase of generating the configuration information; and
determining routing delays during the route phase to programmably interconnect the plurality of integrated circuit blocks.

4. A method in accordance with claim 1 further comprising:
determining a group of programmable logic interconnects between at least two integrated circuit blocks of the integrated circuit; and
executing a beneficial skew optimization engine (BSE) to determine a clock skew to apply to a register to improve an operating frequency of the integrated circuit.

5. A method in accordance with claim 1 further comprising:
determining a data delay and a clock delay to apply to a register of the integrated circuit;
confirming an accuracy of value of the clock delay by executing a beneficial skew optimization engine (BSE), wherein the BSE is configurable to be turned on or off; and
implementing the clock delay within the integrated circuit in response to confirming that the value of the clock delay is accurate.

6. A method in accordance with claim 1 further comprising determining a clock delay, by executing a beneficial skew optimization engine (BSE), wherein the BSE comprises a heuristic approach or a linear approach, wherein the heuristic approach comprises an iterative approach that is limited by runtime or a convergence of the clock delay to a particular value, wherein the iterative approach is configurable to disallow adding a negative amount of skew to generate the clock delay, and wherein the iterative approach is configurable to disallow adding a positive amount of skew to generate the clock delay to cause a hold violation.

7. A method in accordance with claim 1, wherein said splitting comprises splitting the initial clock signal into a delayed clock signal and an undelayed clock signal, wherein the delayed clock signal comprises the split clock signal and the undelayed clock signal comprises the initial clock signal, said method further comprising:
splitting a first clock enable signal into a second clock enable signal and a third clock enable signal, wherein the first clock enable signal applies the initial clock signal to the integrated circuit; and
supplying the second and third clock enable signals to the integrated circuit, wherein the first clock enable signal enables an application of the undelayed clock signal to the integrated circuit and the second clock enable signal enables an application of the delayed clock signal to the integrated circuit.

8. A method in accordance with claim 1, wherein the integrated circuit comprises an integrated circuit block, wherein the integrated circuit block further comprises a plurality of registers, said method further comprising:
generating a delayed clock signal and an undelayed clock signal by said splitting, wherein the delayed clock signal comprises the split clock signal and the undelayed clock signal comprises the initial clock signal;
sending the delayed clock signal to a first register of the plurality of registers; and
sending the undelayed clock signal to a register other than the first register of the plurality of registers;
wherein said promoting comprises promoting all of the plurality of registers to the undelayed clock.

9. A method comprising:
during configuration of an integrated circuit, the integrated circuit comprising a plurality of circuit elements, determining by using a computer device, whether a block of the integrated circuit is a non-critical block by determining whether a clock delay increases an operating frequency of the integrated circuit by a threshold value, wherein the clock delay is applied to the integrated circuit block;
determining whether to split and/or demote an initial clock signal to achieve a beneficial clock skew for the block of the integrated circuit,
wherein said splitting is performed to generate a split clock signal and said demoting is performed to generate a demoted clock signal;
promoting the split and/or demoted clock signal in response to determining that the integrated circuit block is noncritical block and further in response to determining that said splitting and/or demoting is legal based on a number of resources of the integrated circuit in use, wherein said promoting comprises applying the initial clock signal to the integrated circuit block, wherein the initial clock signal comprises a global non-delayed clock signal; and
interconnecting the plurality of circuit elements such that the first circuit element receives the split and/or demoted initial clock signal in response to determining that said splitting and/or demotion is legal.

10. A method in accordance with claim 9 further comprising:
fixing the split and/or demotion in response to determining that the split and/or demotion is illegal.

11. A method in accordance with claim 9, wherein said splitting comprises splitting the initial clock signal into a delayed clock signal and an undelayed clock signal, wherein the delayed clock signal comprises the split clock signal and the undelayed clock signal comprises the initial clock signal, said method further comprising:
splitting a first clock enable signal into a second clock enable signal and a third clock enable signal, wherein the first clock enable signal is used to enable an application of the initial clock signal to the integrated circuit; and
supplying the second and third clock enable signals to the integrated circuit, wherein the first clock enable signal enables an application of the undelayed clock signal and the second clock enable signal enables an application of the delayed clock signal.

12. A system comprising:
a memory device configurable to store information;
a processing unit electrically coupled to said memory device and configurable to:
during a route phase for generating configuration information for an integrated circuit, the integrated circuit comprising a plurality of circuit elements, determine whether a block of the integrated circuit is a non-critical block by determining whether a clock delay increases an operating frequency of the integrated circuit by a threshold value, wherein the clock delay is applied to the integrated circuit block;
determine whether to split and/or demote an initial clock signal to achieve a beneficial clock skew for the block of the integrated circuit during a route phase of generation of configuration information for an integrated circuit, wherein the integrated circuit comprises a plurality of circuit elements, wherein the split is performed to generate a split clock signal and the demotion is performed to generate a demoted clock signal;
promote the split and/or demoted clock signal in response to determining that the integrated circuit block is non-critical block and further in response to determining that said splitting and/or demoting is legal based on a number of resources of the integrated circuit in use, wherein said promoting comprises applying the initial clock signal to the intergrated circut block, wherein the initial clock signal comprises a global non-delayed clock signal; and
interconnect the plurality of circuit elements such that the first circuit element receives the split and/or demoted initial clock signal in response to determining that the split and/or demotion is legal.

13. A system in accordance with claim 12, wherein said processing unit is further configurable to:
fix the split and/or demotion in response to determining that the split or demotion is illegal.

14. A system in accordance with claim 12, wherein said processing unit is further configurable to:
route the initial clock signal via a global clock distribution network;
generate a route netlist comprising a plurality of integrated circuit blocks, of the integrated circuit, wherein the plurality of integrated circuit blocks comprises a plurality of logic elements (LEs), wherein the plurality of LEs comprises a first LE and a second LE, wherein the route netlist is configurable to indicate a connection between the first LE and the second LE, wherein the route phase occurs after a place phase of the generation of the configuration information; and
determine routing delays during the route phase to programmably interconnect the integrated circuit blocks.

15. A system in accordance with claim 12, wherein said processing unit is further configurable to:
determine an operating frequency of the integrated circuit by performing slack allocation, wherein the operating frequency is used to generate a clock delay applied to a register of the integrated circuit; and
determine a clock delay, by executing a beneficial skew optimization engine (BSE), wherein the BSE comprises a heuristic approach or a linear approach, wherein the BSE is configurable to be turned on or off;
determine whether an integrated circuit block of the integrated circuit is a critical or a noncritical block by determining whether a clock delay applied to the integrated circuit block increases the operating frequency of the integrated circuit by a threshold value.

16. A system in accordance with claim 12, wherein said processing unit is further configurable to:
determine a group of programmable logic interconnects between an integrated circuit block of the integrated circuit and other integrated circuit blocks of the integrated circuit; and
determine a clock skew to apply to a register to improve an operating frequency of the integrated circuit.

17. A system in accordance with claim 12, wherein said processing unit is further configurable to:
determine a data delay and a clock delay to apply to a register of the integrated circuit, wherein the clock delay is determined from the data delay to improve an operating frequency of the integrated circuit;

execute a beneficial skew optimization engine (BSE) in response to determining the clock delay that improves the operating frequency of the integrated circuit;

confirm an accuracy of value of the clock delay by the execution of the BSE, wherein the BSE is configurable to turn on or off; and implement the clock delay within the integrated circuit in response to the confirmation.

18. A system in accordance with claim 12, wherein said processing unit is further configurable to:

determine a clock delay, by executing a beneficial skew optimization engine (BSE), wherein the BSE comprises a heuristic approach or a linear approach, wherein the heuristic approach comprises an iterative approach configurable to be limited by runtime or a convergence of the clock delay to a particular value, wherein the iterative approach is configurable to disallow adding a negative amount of skew to generate the clock delay, wherein the iterative approach is configurable to disallow adding a positive amount of skew to generate the clock delay to cause a hold violation, wherein the iterative approach is configurable to add the positive amount of skew to achieve a slack ratio at an input of a register of the integrated circuit less than a set amount.

19. A system in accordance with claim 12, wherein the initial clock signal is split into a delayed clock signal and an undelayed clock signal, wherein the delayed clock signal comprises the split clock signal and the undelayed clock signal comprises the initial clock signal, said processing unit is further configurable to:

split a first clock enable signal into a second clock enable signal and a second clock enable signal, wherein the first clock enable signal is used to enable an application of the clock signal to the integrated circuit; and supply the second and third clock enable signals to the integrated circuit, wherein the first clock enable signal enables an application of the undelayed clock signal and the second clock enable signal enables an application of the delayed clock signal.

20. The method of claim 1 further comprising:

determining an operating frequency of the integrated circuit by performing slack allocation, wherein the operating frequency is used to generate a first clock delay to apply to a register of the integrated circuit;

determining a second clock delay, by executing a beneficial skew optimization engine (BSE), wherein the BSE comprises a heuristic approach or a linear approach, wherein the BSE is configurable to be turned on or off; and comparing the first and second clock delays.

* * * * *